(12) United States Patent
Lünter

(10) Patent No.: US 6,370,252 B1
(45) Date of Patent: Apr. 9, 2002

(54) CIRCUIT ARRANGEMENT FOR TESTING THE CONNECTION OF A SOUND REPRODUCING DEVICE TO A SOUND SIGNAL SOURCE

(75) Inventor: Heinz Lünter, Heuchelheim (DE)

(73) Assignee: Mannesmann VDO AG (DE)

( * ) Notice: Subject to any disclaimer, the term of this patent is extended or adjusted under 35 U.S.C. 154(b) by 0 days.

(21) Appl. No.: 08/627,554

(22) Filed: Apr. 4, 1996

(30) Foreign Application Priority Data

Apr. 7, 1995 (DE) .......................... 195 13 066

(51) Int. Cl.⁷ .............................................. H04R 29/00
(52) U.S. Cl. ........................................... 381/58; 381/77
(58) Field of Search ........................... 381/77, 55, 58, 381/59, 86

(56) References Cited

U.S. PATENT DOCUMENTS

| | | | | |
|---|---|---|---|---|
| 3,989,908 A | * | 11/1976 | Bubrys et al.a | 381/58 |
| 4,100,380 A | * | 7/1978 | Gosswiller | 381/59 |
| 4,110,571 A | * | 8/1978 | Hills | 381/58 |
| 4,554,533 A | * | 11/1985 | Bosnak | 381/59 |
| 4,723,292 A | * | 2/1988 | Taylor | 381/55 |
| 5,345,510 A | * | 9/1994 | Singhi et al. | 381/77 |
| 5,729,661 A | * | 3/1998 | Bonneville | 381/55 |

FOREIGN PATENT DOCUMENTS

| | | | | |
|---|---|---|---|---|
| JP | 53-41218 | * | 4/1978 | 381/55 |
| JP | 62-188597 | * | 8/1987 | 381/55 |
| JP | 62-188598 | * | 8/1997 | 381/55 |

* cited by examiner

Primary Examiner—Xu Mei
(74) Attorney, Agent, or Firm—Robert J. Depke; Mayer, Brown, Rowe & Maw

(57) ABSTRACT

A circuit arrangement for testing the connection of a sound reproducing device to a sound signal source including a power control device for controlling the sound signal power supplied to the sound reproducing device, a voltage measurement device for measuring the supply voltage supplied by the power supply, and a comparison device for comparing the measured values of the supply voltage for two different given values of the sound signal power and for producing a fault signal if the measured values of the supply voltage do not differ from one another by a given amount thus enabling a simple fault diagnosis for the connection of the sound reproducing device and for the device itself to be obtained.

13 Claims, 1 Drawing Sheet

CIRCUIT ARRANGEMENT FOR TESTING THE CONNECTION OF A SOUND REPRODUCING DEVICE TO A SOUND SIGNAL SOURCE

BACKGROUND OF THE INVENTION

1. Field of the Invention

The invention relates to a circuit arrangement for testing the connection of a sound reproducing device to a sound signal source and in particular to such a circuit arrangement for use in a sound reproducing apparatus on board a vehicle, for example a car radio.

2. Description of the Related Art

With such connections between sound signal sources and sound reproducing devices the diagnosis of fault causes in the case of incorrect operation may be difficult depending on the construction. For example, a concealed mounting of such apparatuses may inhibit a rapid location of the fault sources. Particularly in the case of complex apparatuses with a large number of possible fault sources the diagnosis and repair of faults may prove to be very laborious.

SUMMARY OF THE INVENTION

It is an object of the invention to provide a circuit arrangement for testing the connection of a sound reproducing device to a sound signal source and enabling the condition of this connection to be determined simply and rapidly.

According to the invention this object is achieved by a circuit arrangement for testing the connection of a sound reproducing device to a sound signal source, to which sound signal source a supply voltage from a power supply can be applied via an impedance and to which the sound reproducing device is connected, the circuit arrangement comprising

- a power control device for controlling the sound signal power to be supplied to the sound reproducing device by the sound signal source,
- a voltage measurement device for measuring the supply voltage supplied by the power supply via the impedance in dependence on the sound signal power to which the sound signal source has been set, and
- a comparison device for comparing the measured values of the supply voltage for two different given values of the sound signal power, and for producing a fault signal if the measured values of the supply voltage do not differ from one another by a given amount.

The invention enables an effective diagnosis of faults in the connection of a sound reproducing device to a sound signal source without the use of any additional test means. Such a fault diagnosis can be effected very simply, for example without any test equipment, even by an unskilled user. Thus, this user can test the apparatus rapidly and accurately for given fault causes without recourse to, for example, services and personnel of a professional workshop. In such a case fault-finding is also simplified for skilled personnel, which altogether results in a substantial reduction of maintenance and repair costs.

The invention advantageously utilizes the recognition of the fact that the current drawn from the power supply by the sound signal source increases as the sound signal power increases and produces an increasing voltage across the impedance via which the supply voltage is applied from the power supply to the sound signal source. However, the current and the voltage produced by this current will not appear if the sound reproducing device is not connected to the sound signal source. Thus, interruptions of the connection between these two parts of the relevant apparatuses can be detected simply. Conversely, the power supply will have to furnish an excessive current in the case of a short-circuit in the connection between the sound reproducing device and the sound signal source, which also results in a voltage which deviates from the rated value. In this way, it is also possible to detect short-circuits or similar faults.

The relevant impedance need not be included separately in the connection from the power supply to the sound signal source. Preferably, the impedance is formed by a smoothing circuit for the supply voltage, which is present anyway, or a finite internal resistance, which is always available in the case of real power supplies.

According to the invention the circuit arrangement for testing the connection is adapted to perform a comparison measurement to eliminate fluctuations in absolute value of, for example, the voltage furnished by the power supply. Thus, a very fine and accurate detection of even small supply voltage variations is possible.

In an advantageous embodiment of the circuit arrangement in accordance with the invention the power control device, the voltage measurement device and the comparison device are parts of a control circuit for controlling the operation of the sound signal source. Preferably, this control is effected digitally by means of a microprocessor. This minimizes the complexity of the circuitry required for the invention.

In particular, the power control device may also be formed by a volume control included in the control circuit, so that this neither requires any additional circuitry. Testing is performed, for example, by an additional control program incorporated in the microprocessor. Thus, operational control of the normal operation of the sound reproducing device and the sound signal source and control of the test process can be effected by a common component.

In a further embodiment of the invention a device for producing a fault signal in the form of an acoustic signal may be provided, which device in particular comprises a buzzer device. Such a buzzer device, or a similar device for producing an acoustic signal, can produce a simple fault signal independently of the sound reproducing devices to be tested, i.e. also in the case that inadvertently these devices have not been connected. Another possibility of producing a fault signal is an optical indication, for example on a display device which is available anyway for the display of operating parameters of the sound signal source.

Another embodiment of the invention comprises a test sound source for applying a test wave to the sound signal source and, for the measurement of the supply voltage, the sound signal source is adapted to apply a sound signal based on the test wave and having a given sound signal power to the sound reproducing device. As compared with a test by a test signal to be generated by the sound signal source, for example, on the basis of a radio signal received via an antenna, this embodiment of the invention has the advantage that the test is performed on a well-defined basis because unpredictable fluctuations of the signals supplied by the sound signal source can be excluded. An advantageous simplification of the circuitry is obtained by an improved embodiment in that the device for producing the fault signal in the form of an acoustic signal includes the test sound source. This enables the test signal source to be used both for generating the test wave and for generating the fault signal.

In a further embodiment the sound reproducing device comprises at least one loudspeaker and the measurement of the supply voltage can be effected separately for each loudspeaker. This enables an effective testing of more extensive sound reproducing devices, particularly stereo systems in motor vehicles, to be carried out, because these often comprise a plurality of loudspeakers. Advantageously, the program controller for testing the individual loudspeakers is then coupled to the balance and/or fader controls.

BRIEF DESCRIPTION OF THE DRAWINGS

For a fuller understanding of the invention, reference is had to the following description taken in connection with the following drawings, in which:

FIG. 1 shows a sound signal source 1, to which two loudspeakers forming a sound reproducing device 2 are connected. By means of this connection, which in the present example comprises two loudspeaker lines 3, 4, sound signal power is transmitted from the sound signal source 1 to the sound reproducing device 2. To energize the sound signal source with power from a power supply the sound signal source 1 is also connected to a power supply terminal 6 via an impedance 5. A power supply, not shown, can be connected to this power supply terminal and supplies the sound signal source 1 with a supply voltage. Such a power supply is, for example, a mains supply unit, a car battery or the like. In the present example the impedance 5 is a smoothing inductance, which usually has a given ohmic resistance. The impedance 5 may further include an internal resistance of the power supply, not shown. Moreover, a smoothing capacitor 7 is arranged between a terminal of the impedance 5 which is remote from the power supply terminal 6 and ground. The impedance 5 and the smoothing capacitor 7 form a filter or smoothing circuit for the removal of a.c. components superposed on a direct voltage forming the supply voltage on the power supply terminal 6.

In operation of the sound signal source 1 it withdraws power from the power supply, which is partly transferred to the sound reproducing device as sound signal power. This results in a current from the power supply terminal 6 to the sound signal source 1 via the impedance 5, which current increases as the sound signal power increases. This current produces across the impedance 5 (and, if applicable, across the internal resistance, not shown, of the power supply) a voltage by which the supply voltage at the sound signal source decreases in comparison with the no-load condition, in which the sound signal source does not consume any power in the ideal case. The extent of this decrease is determined by the sound signal power and, consequently, by the dimensioning of the sound reproducing device, provided that the connection between the sound signal source and the sound reproducing device via the loudspeaker lines 3, 4 is correct. However, if an interrupted line, a short-circuit or a malfunction which can develop into these extremes occurs, for example a resistance increase in the loudspeaker lines 3, 4, a defective soldered joint, a partial short-circuit in the loudspeakers or the like, the decrease of the supply voltage as a function of the sound signal power setting at the sound signal source 1 will deviate from its nominal variation. This deviation can be detected as an indication of the occurrence of a defect in the connection from the sound reproducing device 2 to the sound signal source 1 and can be represented in the form of a fault signal.

Figure 1:
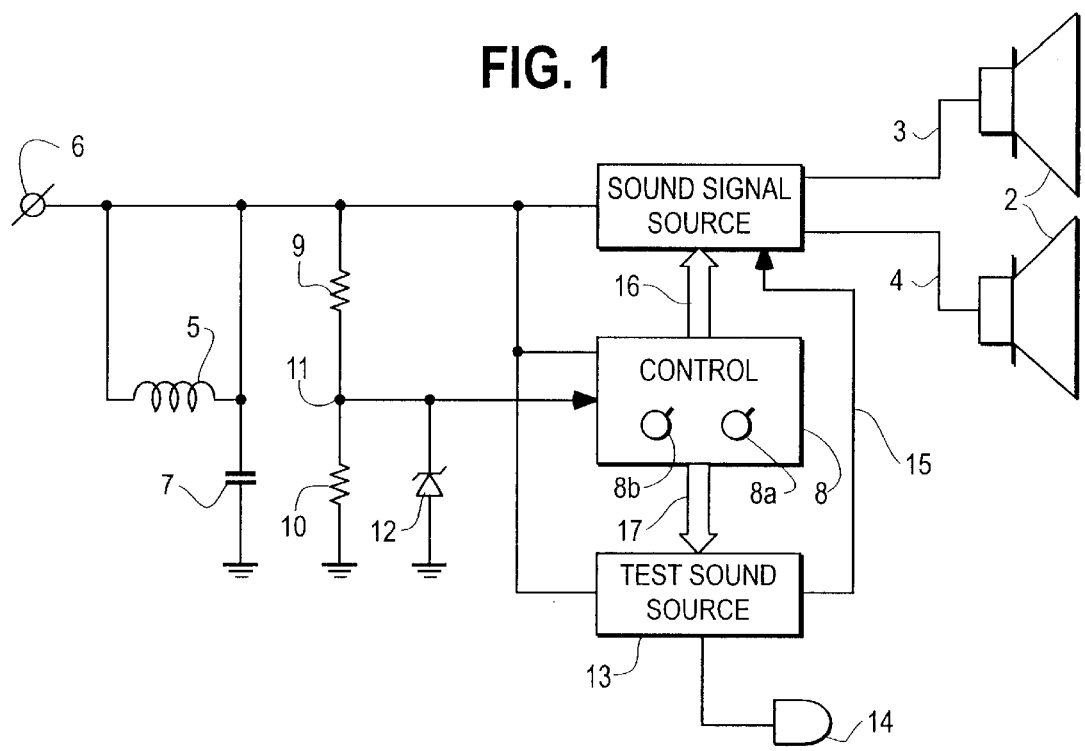
FIG. 1 is a block diagram of a circuit arrangement comprising a sound signal source and a sound reproducing device in an embodiment of the invention.

The circuit arrangement shown in FIG. 1 further comprises a control circuit 8, which like the sound signal source 1 is connected to the power supply terminal 6 via the impedance 5 for the application of power required for operation. Furthermore, a resistive voltage divider comprising two resistors 9, 10 is arranged in parallel with the smoothing capacitor 7. The node between the resistors 9 and 10 forms a tap 11 of the voltage divider 9, 10, a zener diode 12 being arranged between this tap and ground to provide overvoltage protection. The tap 11 also forms a voltage measurement input of the control circuit 8.

A test sound source 13 is also connected to the power supply terminal 6 via the impedance 5 for its power supply. One of its ends is connected to a buzzer device 14 and the other end is connected to the sound signal source 1 via a line 15. Control lines 16 and 17 lead from the control circuit 8 to the sound signal source 1 and the test sound source 13, respectively.

To control the sound signal source 1 the control circuit 8 is connected to this source by the control line 16 to perform the usual control functions, which are not described any further here and which in the case of a car radio include, for example, station selection 8a, volume control 8b, etc. In accordance with the invention the control circuit 8 further comprises a voltage measurement device for measuring the supply voltage applied to the power supply terminal 6 by the power supply via the impedance 5 and taken from the tap 11 via the resistive voltage divider 9, 10. Strictly speaking, the voltage available on the tap 11 has been reduced in proportion to the dimensioning ratio of the resistors 9, 10 but this does not affect the voltage measurement principle.

Figure 2:
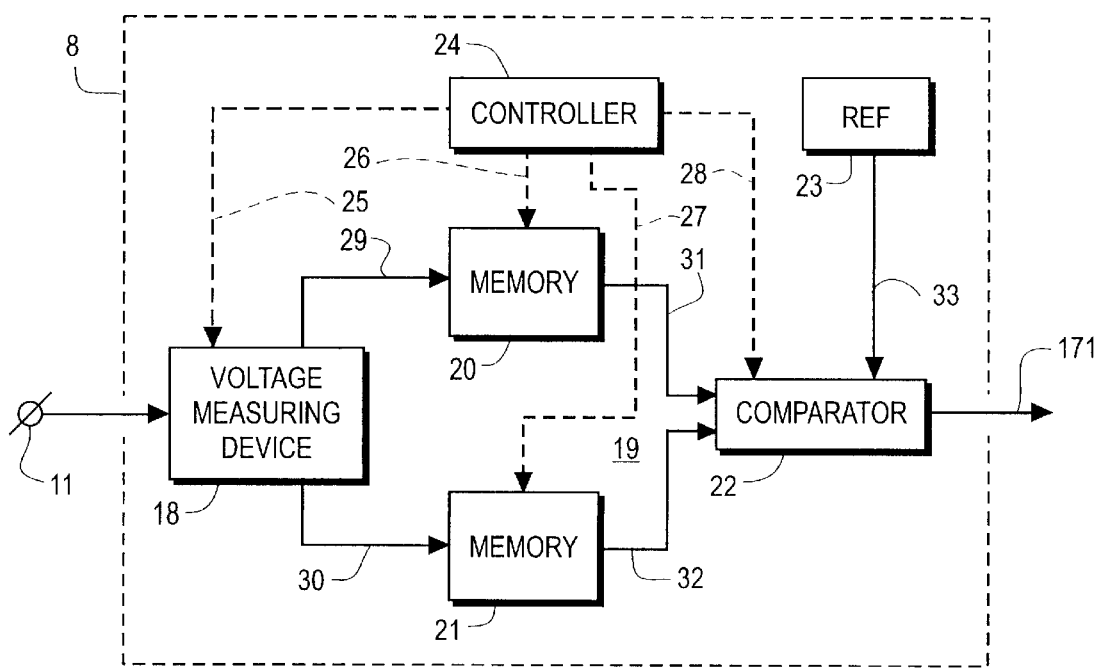
FIG. 2 is a more detailed block diagram of a part of the circuit arrangement shown in FIG. 1.

To elucidate the process of testing, in accordance with the invention, the connection of the sound reproducing device 2 to the sound signal source 1, FIG. 2 shows an example of a part of the control circuit 8, which can be used in the circuit arrangement shown in FIG. 1. The reference numeral 18 refers to the voltage measurement device to which the supply voltage is applied via the tap 11. The control circuit 8 in FIG. 2 further comprises a comparison device 19 consisting of a first memory 20 and a second memory 21 for the supply voltage values measured by the voltage measurement device 18, a comparator stage 22 and a reference value source 23. A program controller 24, which preferably forms part of an arrangement which controls the operation of the sound signal source 1, for example a microprocessor, is connected to the voltage measurement device 18, the first and the second memory 20, 21 and the comparator stage 22 by control connections 25, 26, 27 and 28, respectively. Furthermore, there are connections 29, 30, 31, 32 for the measurement values of the supply voltage between the voltage measurement device 18 and the first memory 20, the voltage measurement device 18 and the second memory 21, the first memory 20 and the comparator stage 22, and the second memory 21 and the comparator stage 22, respectively. A further connection 33 has been provided between the comparator stage 22 and the reference value source 23 to apply a signal representing the given amount for the deviation of the values of the supply voltage during the measurements to be carried out. The comparator stage 22 has a connection 171, which forms part of the control line 17 and which serves for supplying a fault signal produced by the comparator stage 22.

The power control device for controlling the sound signal power to be supplied to the sound reproducing device 2 by the sound signal source 1 is not shown in FIG. 2 because it is of a customary construction. To test the connection of the sound reproducing device 2 in a manner in accordance with the invention the sound signal source is first set to a first given value of the sound signal power by the power control device. In order to obtain well-defined sound signal powers the control circuit 8 then preferably controls the test sound source 13 via the control line 17 so as to apply a test wave to the sound signal source 1 via the line 15. This precludes uncontrolled power fluctuations resulting from non-controllable fluctuations of other sound signals available at the sound signal source 1, for example antenna signals.

After the first given value of the sound signal power has been set the current taken from the power supply via the power supply terminal 6 and the impedance 5 give rise to a first measured value of the supply voltage, which under control of the program controller 24 is loaded into the first memory 20 via the connection 29 and is stored in this memory. Subsequently, the program controller 24 sets the sound signal source 1 to a second given value of the sound signal power and the voltage measurement device 18 provides a second measured value in a manner similar to the first measured value of the supply voltage. This second measured value is loaded into the second memory 21 via the connection 30. The comparator stage 22 then forms the difference between the measurement values of the supply voltage stored in the memories 20 and 21. This difference is compared with the signal from the reference value source which represents a given amount and which is applied via the connection 33. If the difference exceeds the given amount it may be interpreted as an indication of an at least partial short-circuit in the connection of the sound reproducing device 2 or in the device itself; conversely, if the difference is smaller than the given amount, this is an indication for an interrupted line in the sound reproducing device 2 or its connection. In both cases a fault signal is supplied via the connection 171. This fault signal may be the same but it may also be different for both fault types and thus cause the test sound source 13 to produce an acoustic signal which is the same or different for the two fault situations. Thus, the test sound source 13 also serves for the formation of this acoustic signal and for this purpose it is connected to the buzzer device 14.

The processing of said difference between two measurement values of the supply voltage in the comparator stage effectively eliminates the influence on the test of fluctuations of the absolute values of the supply voltage, caused by for example different charging conditions of a car battery producing the supply voltage. For further avoiding erroneous fault signals, a tolerance range may be provided around the given amount, within which range said difference between the measurement values is considered to be permissible. Moreover, for a more precise fault detection, the test may be carried out separately for each loudspeaker of the sound reproducing device 2.

A very advantageous and simple implementation of the described circuit arrangement in accordance with the invention is obtained if the apparatus comprising the sound signal source 1 and the sound reproducing device 2 already includes a monitoring device for the supply voltage, which monitors the absolute value of this voltage in order to ensure an adequate power supply to the sound signal source and the sound reproducing device. This monitoring device can then be combined very economically with the voltage measurement device 18; if desired, the voltage measurement device 18 may form part of this monitoring device.

I claim:

1. A circuit arrangement for testing the connection between a sound reproducing device and a sound signal source, the circuit arrangement comprising:
   a power control for controlling a sound signal power supplied to the sound reproducing device by the sound signal source to first and second power levels;
   a measurement device for measuring the voltage supplied by the sound signal source depending on the sound signal power to which the sound signal source has been set, and
   a comparison device for comparing measure values of the voltage for the first and second power levels, and for producing a fault signal if the measured values of the supply voltage do not differ from one another by an amount within a predetermined range.

2. The circuit arrangement as claimed in claim 1, wherein the power control, the voltage measurement device and the comparison device are parts of a control circuit for controlling operation of the sound signal source.

3. The circuit arrangement as claimed in claim 2, wherein the power control is a volume control present in the control circuit.

4. The circuit arrangement claimed in claim 1 and further comprising a device for producing the fault signal in the form of an acoustic signal.

5. The circuit arrangement as claimed in claim 4, wherein the device for producing the fault signal in the form of an acoustic signal comprises a buzzer device.

6. The circuit arrangement as claimed in claim 4, wherein there has been provided a test sound source for applying a test wave to the sound signal source and, for the measurement of the supply voltage, the sound signal source is adapted to apply a sound signal based on the test wave and having a given sound signal power to the sound reproducing device.

7. The circuit arrangement as claimed in claim 6 wherein that the device for producing the fault signal in the form of an acoustic signal includes the test sound source.

8. A circuit arrangement as claimed in claims 1, wherein the sound reproducing device comprises at least one loudspeaker and the measurement of the supply voltage can be effected separately for each loudspeaker.

9. A circuit arrangement as claimed in claim 2, further comprising a test sound source for applying a test wave to the sound signal source and, for the measurement of the voltage, the sound signal source adapted to apply a sound signal based on the test wave and having a given sound signal power.

10. A circuit arrangement as claimed in claim 3, further comprising a test sound source for applying a test wave to the sound signal source and, for the measurement of the supply voltage, the sound signal source adapted to apply a sound signal based on the test wave and having a given sound signal power.

11. A circuit arrangement as claimed in claim 4, further comprising a test sound source for applying a test wave to the sound signal source and, for the measurement of the supply voltage, the sound signal source adapted to apply a sound signal based on the test wave and having a given sound signal power.

12. A circuit arrangement as claimed in claim 5, further comprising a test sound source for applying a test wave to the sound signal source and, for the measurement of the supply voltage, the sound signal source adapted to apply a sound signal based on the test wave and having a given sound signal power.

13. A method for testing the connection between a sound reproducing device and a sound signal source comprising the steps of:

controlling a sound signal power of the sound signal source to first and second power levels;

measuring a voltage supplied by the sound signal source at the first and second power levels and producing a fault signal if a difference in the measured voltages for the first and second power levels does not fall within a predetermined range.

* * * * *